US009876094B2

(12) United States Patent
Bae et al.

(10) Patent No.: US 9,876,094 B2
(45) Date of Patent: Jan. 23, 2018

(54) METHOD FOR FABRICATING SEMICONDUCTOR DEVICE HAVING A SILICIDE LAYER

(71) Applicant: SAMSUNG ELECTRONICS CO., LTD., Suwon-si, Gyeonggi-do (KR)

(72) Inventors: Deok-Han Bae, Hwaseong-si (KR); Kyung-Soo Kim, Hwaseong-si (KR); Chul-Sung Kim, Seongnam-si (KR); Woo-Cheol Shin, Seoul (KR); Hwi-Chan Jun, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/984,037

(22) Filed: Dec. 30, 2015

(65) Prior Publication Data
US 2016/0343825 A1 Nov. 24, 2016

(30) Foreign Application Priority Data
May 20, 2015 (KR) .......................... 10-2015-0070243

(51) Int. Cl.
| *H01L 29/66* | (2006.01) |
| *H01L 29/45* | (2006.01) |
| *H01L 21/8234* | (2006.01) |
| *H01L 21/285* | (2006.01) |
| *H01L 23/485* | (2006.01) |
| *H01L 21/768* | (2006.01) |
| *H01L 29/417* | (2006.01) |
| *H01L 29/51* | (2006.01) |
| *H01L 29/78* | (2006.01) |

(52) U.S. Cl.
CPC ...... *H01L 29/665* (2013.01); *H01L 21/28518* (2013.01); *H01L 21/76804* (2013.01); *H01L 21/76831* (2013.01); *H01L 21/76843* (2013.01); *H01L 21/76855* (2013.01); *H01L 21/823418* (2013.01); *H01L 21/823437* (2013.01); *H01L 23/485* (2013.01); *H01L 29/66636* (2013.01); *H01L 21/76805* (2013.01); *H01L 21/76865* (2013.01); *H01L 29/41766* (2013.01); *H01L 29/513* (2013.01); *H01L 29/517* (2013.01); *H01L 29/7848* (2013.01)

(58) Field of Classification Search
None
See application file for complete search history.

(56) References Cited

U.S. PATENT DOCUMENTS

| 7,397,131 | B2 | 7/2008 | Kim et al. |
| 7,816,271 | B2 | 10/2010 | Lee et al. |
| 8,030,210 | B2 | 10/2011 | Wang et al. |
| 8,349,716 | B2 | 1/2013 | Cai et al. |

(Continued)

Primary Examiner — Alexander Ghyka
(74) Attorney, Agent, or Firm — F. Chau & Associates, LLC

(57) ABSTRACT

A method for fabricating a semiconductor device is provided. The method includes forming a gate electrode and a source or drain disposed at opposite sides of the gate electrode, forming an interlayer insulating layer covering the gate electrode and the source or drain, forming a contact hole exposing the source or drain in the interlayer insulating layer, forming a silicide layer on a bottom surface of the contact hole, and forming a spacer on sidewalls of the contact hole and an upper surface of the silicide layer.

20 Claims, 21 Drawing Sheets

(56) References Cited

U.S. PATENT DOCUMENTS

| | | |
|---|---|---|
| 8,796,099 B2 | 8/2014 | Alptekin et al. |
| 8,912,057 B1 | 12/2014 | Deniz |
| 8,921,947 B1 | 12/2014 | Hung et al. |
| 8,927,422 B2 | 1/2015 | Alptekin et al. |
| 2006/0278985 A1* | 12/2006 | Lim .................. H01L 21/28518 257/741 |
| 2009/0072400 A1 | 3/2009 | Zhu et al. |
| 2012/0292670 A1 | 11/2012 | Cai et al. |
| 2014/0306290 A1 | 10/2014 | Alptekin et al. |
| 2014/0361376 A1 | 12/2014 | Lii |
| 2014/0374816 A1 | 12/2014 | Funayama et al. |
| 2015/0021683 A1 | 1/2015 | Xie et al. |
| 2015/0028423 A1 | 1/2015 | Park et al. |
| 2015/0044844 A1 | 2/2015 | Lee et al. |

* cited by examiner

1200

1300

METHOD FOR FABRICATING SEMICONDUCTOR DEVICE HAVING A SILICIDE LAYER

CROSS-REFERENCE TO RELATED APPLICATION

This U.S. non-provisional patent application claims priority under 35 U.S.C. §119 to Korean Patent Application No. 10-2015-0070243, filed on May 20, 2015, in the Korean Intellectual Property Office (KIPO), the contents of which are herein incorporated by reference in their entirety.

TECHNICAL FIELD

The present inventive concept relates to a method for fabricating a semiconductor device having a silicide layer.

DISCUSSION OF THE RELATED ART

In accordance with the recent trend toward large-capacity and highly integrated semiconductor devices, a design rule of a semiconductor device is rapidly decreasing and semiconductor devices requiring a small amount of power and a high-speed operation are widely used. In order to solve a problem of increasing resistance due to a reduction in the line width of a semiconductor device, attempts to reduce surface resistance and contact resistance are being made by forming a silicide on a contact region between a gate and a source or drain.

SUMMARY

An aspect of the present inventive concept provides a method for fabricating a semiconductor device, which can fabricate a silicide capable of reducing surface resistance or contact resistance of a source or drain region.

An aspect of the present inventive concept provides a method of fabricating a semiconductor device, which can prevent a short between a gate electrode and a contact by forming a spacer in the contact.

These and other features of the present inventive concept will be described in or be apparent from the following description of the preferred embodiments.

According to an aspect of the present inventive concept, there is provided a method for fabricating a semiconductor device, the method including forming a gate electrode and a source or drain disposed at opposite sides of the gate electrode, forming an interlayer insulating layer covering the gate electrode and the source or drain, forming a contact hole exposing the source or drain in the interlayer insulating layer, forming a silicide layer on a bottom surface of the contact hole, and forming a spacer on sidewalls of the contact hole and an upper surface of the silicide layer.

In some embodiments of the present inventive concept, a bottom end of the spacer is in contact with an edge of the upper surface of the silicide layer.

In some embodiments of the present inventive concept, at least a center portion of the silicide layer is exposed by the spacer.

In some embodiments of the present inventive concept, the spacer extends from the upper surface of the silicide layer to an upper region of the contact hole along the sidewalls of the contact hole.

In some embodiments of the present inventive concept, a width of the spacer is smaller than a width of the upper surface of the silicide layer.

In some embodiments of the present inventive concept, the bottom end of the spacer entirely overlaps the silicide layer.

In some embodiments of the present inventive concept, the forming of the spacer comprises forming a spacer insulating layer conformally covering the upper surface of the silicide layer and the sidewalls of the contact hole and removing a portion of the spacer insulating layer formed on the upper surface of the silicide layer.

In some embodiments of the present inventive concept, the forming of the silicide layer comprises forming a metal layer conformally covering a bottom surface of the contact hole and the sidewalls of the contact hole, annealing the metal layer, and removing the metal layer covering the sidewalls of the contact hole.

In some embodiments of the present inventive concept, at least some portions of lateral surfaces of the silicide layer are in contact with the sidewalls of the interlayer insulating layer.

In some embodiments of the present inventive concept, the method further comprises forming a contact filling the contact hole on the spacer.

According to another aspect of the present inventive concept, there is provided a method for fabricating a semiconductor device, the method including forming a first gate electrode and a second gate electrode adjacent to each other and a source or drain between the first gate electrode and the second gate electrode; forming a first spacer defining a contact hole exposing the source or drain on sidewalls of the first gate electrode and sidewalls of the second gate electrode, respectively; forming a silicide layer on a bottom surface of the contact hole; and forming a second spacer on sidewalls of the contact hole and an upper surface of the silicide layer.

In some embodiments of the present inventive concept, a bottom end of the second spacer is in contact with an edge of the upper surface of the silicide layer.

In some embodiments of the present inventive concept, at least a center portion of the silicide layer is exposed by the second spacer.

In some embodiments of the present inventive concept, a width of the second spacer is smaller than a width of the upper surface of the silicide layer.

In some embodiments of the present inventive concept, at least some portions of lateral surfaces of the silicide layer are in contact with the sidewalls of the first spacer.

According to another aspect of the present inventive concept, there is provided a method for fabricating a semiconductor device, the method including forming a gate electrode on a substrate, forming a source or drain on at least one side of the gate electrode, forming an interlayer insulating layer covering the gate electrode and the source or drain, forming a contact hole exposing the source or drain in the interlayer insulating layer, forming an metal layer covering the a bottom surface of the contact hole, annealing the metal layer to form a silicide layer, forming a spacer exposing an upper surface of the silicide layer on a sidewall of the contact hole, forming a contact barrier layer covering a side wall of the spacer and the portion of the upper surface of the silicide layer, forming a contact metal pattern filling the contact hole on the contact barrier layer.

In some embodiments of the present inventive concept, a bottom end of the spacer is in contact with an upper surface of the silicide layer.

In some embodiments of the present inventive concept, a width of the spacer is smaller than a width of the upper surface of the silicide layer.

In some embodiments of the present inventive concept, the bottom end of the spacer entirely overlaps the silicide layer.

In some embodiments of the present inventive concept, at least some portions of lateral surfaces of the silicide layer are in contact with the sidewalls of the interlayer insulating layer.

BRIEF DESCRIPTION OF THE DRAWINGS

The above and other features and aspects of the present inventive concept will become more apparent by describing in detail preferred embodiments thereof with reference to the attached drawings in which:

FIGS. 2 to 11 illustrate a method for fabricating a semiconductor device according to an embodiment of the present inventive concept in which:

FIG. 2 shows a substrate including a first gate electrode and a second gate electrode formed to be spaced apart from each other, and an interlayer insulating layer covering the first gate electrode and the second gate electrode;

FIG. 3 shows a contact hole T is formed in the interlayer insulating layer to expose the source/drain included in the substrate between the first gate electrode and the second gate electrode:

FIG. 4 shows a contact hole T being additionally enlarged by directional etching using a dry etching process;

FIG. 5 shows a metal layer may be conformally formed in the contact hole T;

FIG. 6 shows the contact hole T after the metal layer formed on the sidewalls T is removed;

FIG. 7 shows the metal layer disposed on the source/drain;

FIG. 8 shows a silicide layer disposed on the source/drain;

FIG. 9 shows a spacer insulating layer may be conformally formed in the contact hole T to cover the silicide layer;

FIG. 10 shows a spacer being formed by removing a spacer insulating layer, and the silicide layer being disposed on an upper surface of the interlayer insulating layer;

FIG. 11 shows a contact barrier layer and a contact metal pattern are formed in the contact hole T;

DETAILED DESCRIPTION OF THE EMBODIMENTS

Figure 1:
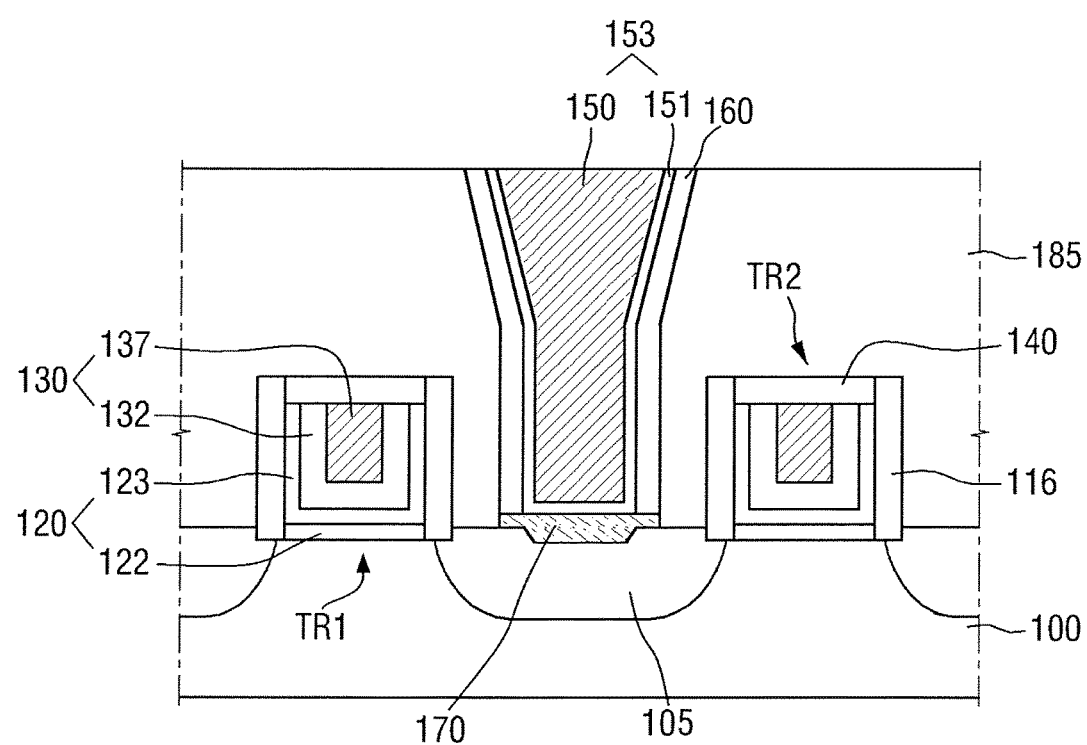
FIG. 1 is a cross-sectional view of a semiconductor device according to an embodiment of the present inventive concept.

Aspects and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this inventive concept will be thorough and complete and will fully convey the concept of the present inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the present inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to an embodiment of the present inventive concept and a method for fabricating the same will now be described with reference to FIGS. 1 to 11.

FIG. 1 is a cross-sectional view of a semiconductor device according to an embodiment of the present inventive concept.

Referring to FIG. 1, the semiconductor device according to an embodiment of the present inventive concept includes a substrate 100, a first gate electrode TR1, a second gate electrode TR2, an interlayer insulating layer 185, a contact metal pattern 150, a contact barrier layer 151, a silicide layer 170 and a spacer 160. In addition, the contact metal pattern 150 and the contact barrier layer 151 may form a contact 153. Meanwhile, in some embodiments of the present inventive concept, the interlayer insulating layer 185 may be defined as a first spacer and the spacer 160 may be defined as a second spacer.

The substrate 100 may be, for example, bulk silicon or a silicon-on-insulator (SOI). Alternatively, the substrate 100 may be a silicon substrate, or a substrate made of other materials selected from the group consisting of, for example, germanium, silicon germanium, indium antimonide, lead telluride compound, indium arsenide, indium phosphide, gallium arsenide, and gallium antimonide. In addition, the substrate 100 may be an epitaxial layer formed on a base substrate. However, aspects of the present inventive concept are not limited thereto.

The substrate 100 may include a source/drain 105. In detail, the source/drain 105 may be formed in the substrate 100 between the first and second gate electrodes TR1 and TR2 adjacent to each other. Although not specifically shown, the source/drain 105 may be formed in an active layer. The source/drain 105 may include, for example, an element semiconductor material, such as silicon or germanium. In addition, the source/drain 105 may include a compound semiconductor, such as a group IV-IV compound semiconductor, or a group III-V compound semiconductor. In detail, the source/drain 105 may include the group IV-IV compound semiconductor, including, for example, a binary compound or a ternary compound, including two or more group IV elements, such as carbon (C), silicon (Si), germanium (Ge), or tin (Sn), or a compound prepared by doping a group IV element into the binary or ternary compound. In addition, the fin type active pattern may include the group III-V compound semiconductor, including, for example, a binary compound, a ternary compound or a quaternary compound, prepared by combining at least one group III element of aluminum (Al), gallium (Ga and indium (In) with at least one group V element of phosphorus (P), arsenic (As) and antimony (Sb). Although not shown, the source/drain 105 may have a lightly doped drain (LDD) structure, but aspects of the present inventive concept are not limited thereto.

The first gate electrode TR1 and the second gate electrode TR2 may be formed on the substrate 100 so as to be spaced apart from each other. Here, the first gate electrode TR1 and the second gate electrode TR2 may have substantially the same configuration.

The first gate electrode TR1 may include a first gate spacer 116, a first insulation layer pattern 120, a first gate electrode pattern 130, and a first capping pattern 140.

The first gate spacer 116 may include, for example, at least one of a nitride layer, an oxynitride layer, a low-k material. The first gate spacer 116 may be formed by, for example, chemical vapor deposition (CVD). The first gate spacer 116 formed as a single layer is illustrated, but aspects of the present inventive concept are not limited thereto. The first gate spacer 116 may be formed to have multiple layers.

In addition, the first gate spacer 116 having an I-letter shaped lateral surface is illustrated, but aspects of the present inventive concept are not limited thereto. The shape of the first gate spacer 116 may be varied. Unlike in the illustrated embodiment, the first gate spacer 116 may have a curved or L-letter shaped lateral surface.

The first insulation layer pattern 120 may include a first interface layer 122 and a first gate insulation layer 123.

The first interface layer 122 may prevent an interfacial failure from occurring between the substrate 100 and the first gate insulation layer 123.

The first interface layer 122 may include a low-k dielectric material having a dielectric constant (k) of 9 or less, for example, a silicon oxide layer (k≈4) or a silicon oxynitride layer k≈4~8 according to the concentration of oxygen and nitrogen atoms). Alternatively, the first interface layer 122 may include silicate or a combination of layers listed above.

The first interface layer 122 may be formed by, for example, chemical oxidation, UV oxidation or dual plasma oxidation.

The first gate insulation layer 123 may be formed on the first interface layer 122. However, when the first interface layer 122 is not provided, the first gate insulation layer 123 may be formed on the substrate 100.

The first gate insulation layer 123 may include a high-k material. The first gate insulation layer 123 may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but aspects of the present inventive concept are not limited thereto.

Meanwhile, the first gate insulation layer 123 may be formed to have an appropriate thickness according to the kind of a device to be formed. For example, when the first gate insulation layer 123 includes $HfO_2$, it may be formed to have a thickness of about 50 Å or less (in a range of about 5 Å to about 50 Å), but aspects of the present inventive concept are not limited thereto. In some embodiments of the present inventive concept, as shown in FIG. 1, the first gate insulation layer 123 may upwardly extend along sidewalls of the first gate spacer 116.

The first gate electrode pattern 130 may include a first work function control layer 132 and a first gate metal 137.

The first work function control layer 132 may be formed on the first gate insulation layer 123. The first work function control layer 132 may be formed to be in contact with the first gate insulation layer 123. The first work function control layer 132 may be used to control a work function.

The first work function control layer 132 may include, for example, metal nitride. The first work function control layer 132 may include different materials according to types of the semiconductor device. A p-type work function control layer may include, for example, at least one of TiN, WN, TaN, Ru and combinations thereof, but aspects of the present inventive concept are not limited thereto. In addition, an n-type work function control layer may include, for example, at least one of Ti, Ag, Al, TiAl, TiAlN, TiAlC, TaC, TaCN, TaSiN, Mn, Zr and combinations thereof, but aspects of the present inventive concept are not limited thereto.

In addition, the p-type work function control layer may include a single layer made of TiN or dual layers of a TiN lower layer and a TaN upper layer, but aspects of the present inventive concept are not limited thereto.

According to some embodiments of the present inventive concept, as shown in FIG. 1, the first work function control layer 132 may also upwardly extend along sidewalls of the first gate spacer 116.

The first gate metal 137 may be formed on the first work function control layer 132. As shown, the first gate metal 137 may be formed to be in contact with the first work function control layer 132. That is to say, the first gate metal 137 may be formed to fill a space created by the first work function control layer 132. The first gate metal 137 may include a conductive material, for example, W or Al, but aspects of the present inventive concept are not limited thereto.

The first capping pattern 140 may be formed on the first gate metal 137. As shown, the first capping pattern 140 may be formed to be in contact with the first gate metal 137. The first capping pattern 140 may include, for example, at least one of silicon nitride (SiN), silicon oxynitride (SiON), silicon oxide ($SiO_2$), silicon carbonitride (SiCN), silicon oxycarbonitride (SiOCN) and combinations thereof.

In the present embodiment, the first and second gate electrodes TR1 and TR2 may be formed by, for example, a gate last process, but aspects of the present inventive concept are not limited thereto.

The interlayer insulating layer 185 may be formed on the substrate 100 and may be formed to surround the first gate electrode TR1 and the second gate electrode TR2. The interlayer insulating layer 185 may include, for example, at least one of a low-k material, an oxide layer, a nitride layer and an oxynitride layer. The low-k material may include, for example, at least one of silicon oxide, silicon nitride, silicon oxynitride, and a low-k material. The low-k material may include flowable oxide (FOX), Tonen silazene (TOSZ), undoped silicate glass (USG), borosilica glass (BSG), phosphosilaca glass (PSG), borophosphor silica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and combinations thereof, but aspects of the present inventive concept are not limited thereto.

The interlayer insulating layer 185 may be made of, for example, tetraethylortho silicate (TEOS).

The silicide layer 170 may be formed on the source/drain 105. The silicide layer 170 may include at least one of NiPtSi, NiSi, CoSi, and TiSi, but aspects of the present inventive concept are not limited thereto. The silicide layer 170 may be insulated from the first and second gate electrodes TR1 and TR2 by the first gate spacer 116 and the interlayer insulating layer 185.

The silicide layer 170 may be formed on the source/drain 105 exposed to the outside using a silicide process before a contact barrier layer 151 and a contact metal pattern 150 to be described later are formed.

In the present embodiment, the silicide layer 170 having a top width greater than a bottom width is illustrated, but aspects of the present inventive concept are not limited thereto. Therefore, the silicide layer 170 may have various shapes according to processing conditions. In addition, in the present embodiment, the silicide layer 170 having a bottom protrusion engaged with a concave portion of the source/drain 105 is illustrated, but aspects of the present inventive concept are not limited thereto.

The contact barrier layer 151 may be formed on an active region of the substrate 100 to cover sidewalls and a bottom surface of a contact hole by etching a portion of the interlayer insulating layer 185. The contact barrier layer 151 may include, for example, Ti or TiN, and may include a stack of Ti and TiN layers. The contact barrier layer 151 may be formed by atomic layer deposition (ALD) or chemical vapor deposition (CVD).

The contact metal pattern 150 may be formed on the contact barrier layer 151. The contact metal pattern 150 may include a metallic material. For example, the contact metal pattern 150 may include tungsten (W), aluminum (Al), cobalt (Co), and the like, but aspects of the present inventive concept are not limited thereto. The contact metal pattern 150 may be a conductive pattern electrically connecting an upper semiconductor pattern and a lower semiconductor pattern.

The spacer 160 may be formed to be in contact with some portions of sidewalls in a contact hole T formed by etching a portion of the interlayer insulating layer 280. The contact hole T may be formed in the interlayer insulating layer 185 to expose the source/drain 105 of the substrate 100 between the first gate electrode TR1 and the second gate electrode TR2. That is to say, a bottom surface of the contact hole T may correspond to the source/drain 105. The spacer 160 may be formed to be spaced apart from the first gate electrode TR1 and the second gate electrode TR2.

That is to say, while removing a portion of the interlayer insulating layer 185 between the first gate electrode TR1 and the second gate electrode TR2, the interlayer insulating layer 185 may partially remain between the contact hole T and the first gate electrode TR1 and between the contact hole T and the second gate electrode TR2, thereby forming the spacer 160 in the contact hole T so as to be spaced apart from the first gate electrode TR1 and the second gate electrode TR2.

According to the present inventive concept, the spacer 160 may upwardly extend from an upper surface of the silicide layer 170 along sidewalls of the contact hole T. The spacer 160 extending to an upper surface of the interlayer insulating layer 185 is illustrated, but aspects of the present inventive concept are not limited thereto.

Meanwhile, the spacer 160 upwardly extends along the sidewalls of the contact hole T so as to be positioned higher than the first gate electrode TR1 and the second gate electrode TR2.

In the present inventive concept, since the spacer 160 prevents electrical shorts between the first and second gate electrodes TR1 and TR2 and the contact metal pattern 150, it may upwardly extend to be positioned higher than the first and second gate electrodes TR1 and TR2 to prevent the contact metal pattern 150 and the first and second gate electrodes TR1 and TR2 from contacting each other.

A top end of the spacer 160 may have a slope and a bottom end of the spacer 160 may be parallel to that of a facing spacer due to an enlargement process performed when the contact hole T is formed, which will later be described in detail.

In addition, the bottom surface of the spacer 160 may come in contact with the silicide layer 170. After a portion of the interlayer insulating layer 185 is removed to expose the substrate 100 between the first gate electrode TR1 and the second gate electrode TR2, the silicide layer 170 is formed on the substrate 100 earlier than the spacer 160, so that a material of the spacer 160 may be conformally formed in the contact hole T to make the bottom surface of the spacer 160 come in contact with the upper surface of the silicide layer 170 in the course of forming the spacer 160. Since the forming of the spacer 160 is completed by removing the material of the spacer 160 (that is, a bottom surface of the material of the spacer 160), the bottom surface of the spacer 160 may come in contact with the upper surface of the silicide layer 170.

The spacer 160 may include, for example, at least one of silicon nitride (SiN), silicon oxynitride (SiON), silicon oxide (SiO$_2$), and silicon oxycarbonitride (SiOCN). The spacer 160 may be formed by, for example, chemical vapor deposition (CVD). In addition, the spacer 160 may include a different material from the interlayer insulating layer 185.

Since the contact barrier layer 151 and the contact metal pattern 150 are formed within the spacer 160 formed on the sidewalls of the contact hole T, they may be formed to be spaced apart from the first gate electrode TR1 and the second gate electrode TR2. In addition, since the contact barrier layer 151 is deposited on the spacer 160 and is filled with the contact metal pattern 150, the spacer 160 may be formed to make direct contact with the contact barrier layer 151.

In the illustrated embodiment of the present inventive concept, an enlargement process is further performed on the formed contact hole T, and an upper pattern of the contact metal pattern 150 may have a greater width than a lower pattern thereof.

Hereinafter, a method for fabricating a semiconductor device according to an embodiment of the present inventive concept will now be described with reference to FIGS. 2 to 11.

Figure 2:
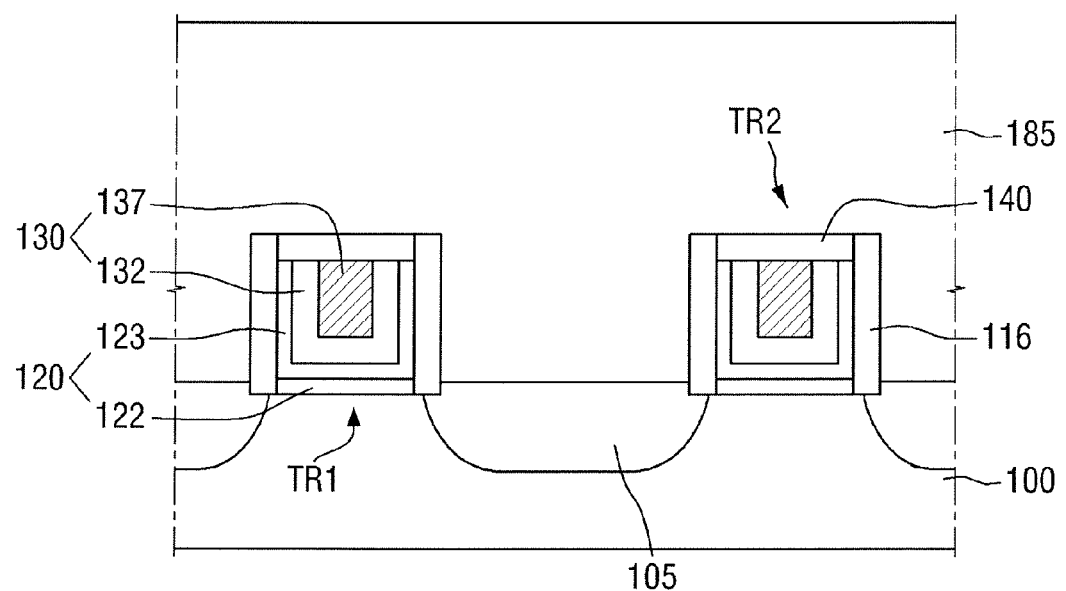

Referring to FIG. 2, a substrate 100 is prepared, the substrate 100 including a first gate electrode TR1 and a second gate electrode TR2 formed to be spaced apart from each other, and an interlayer insulating layer 185 covering the first gate electrode TR1 and the second gate electrode TR2. The substrate 100 may include a source/drain 105 between the first gate electrode TR1 and the second gate electrode TR2.

The source/drain 105 may be formed by forming a recess and performing epitaxial growth on the recess, but aspects of the present inventive concept are not limited thereto.

Figure 3:
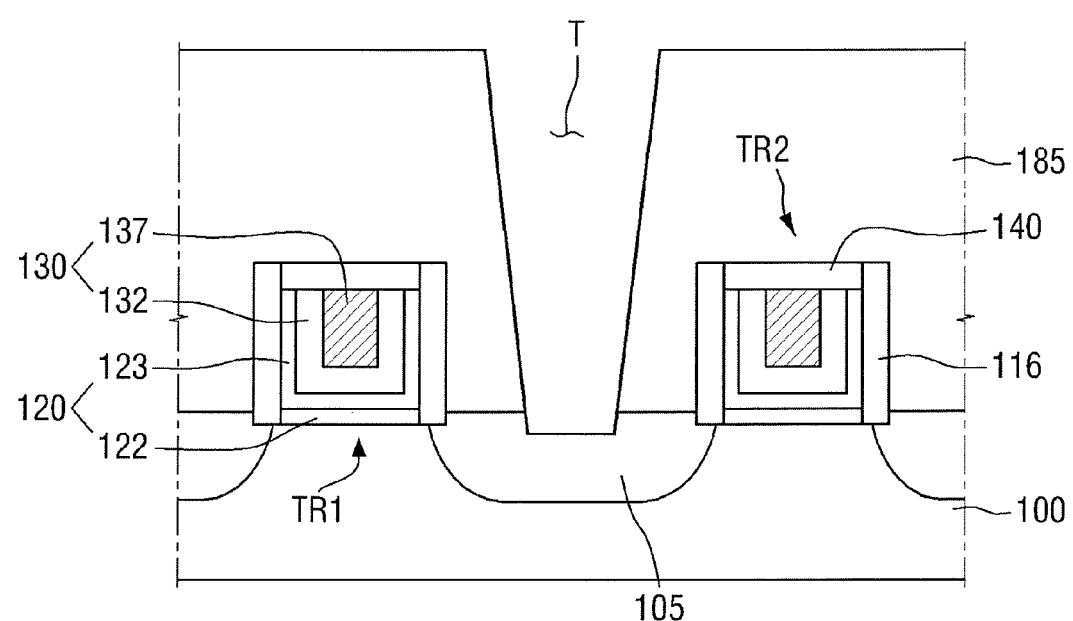

Referring to FIG. 3, a contact hole T is formed in the interlayer insulating layer 185 so as to expose the source/drain 105 included in the substrate 100 between the first gate electrode TR1 and the second gate electrode TR2.

The forming of the contact hole T in the interlayer insulating layer 185 may be completed by removing a portion of the interlayer insulating layer 185 using, for example, dry etching, wet etching or a combination thereof.

In detail, the contact hole T may be formed by forming a photo resist pattern (not shown) masking a region other than a contact hole forming region on the interlayer insulating layer 185 and etching the contact hole forming region exposed by the photo resist pattern, but aspects of the present inventive concept are not limited thereto.

The contact hole T may be formed to have a tapered shape. That is to say, the contact hole T may be formed to have a trapezoidal shape or an inverted trapezoidal shape, but aspects of the present inventive concept are not limited thereto. The contact hole T may be formed to have a rectangular shape. The contact hole T may be formed by etching a portion of the source/drain 105. For example, as shown, the contact hole T may be formed to have a predetermined depth from an upper surface of the source/drain 105, but aspects of the present inventive concept are not limited thereto.

Figure 4:
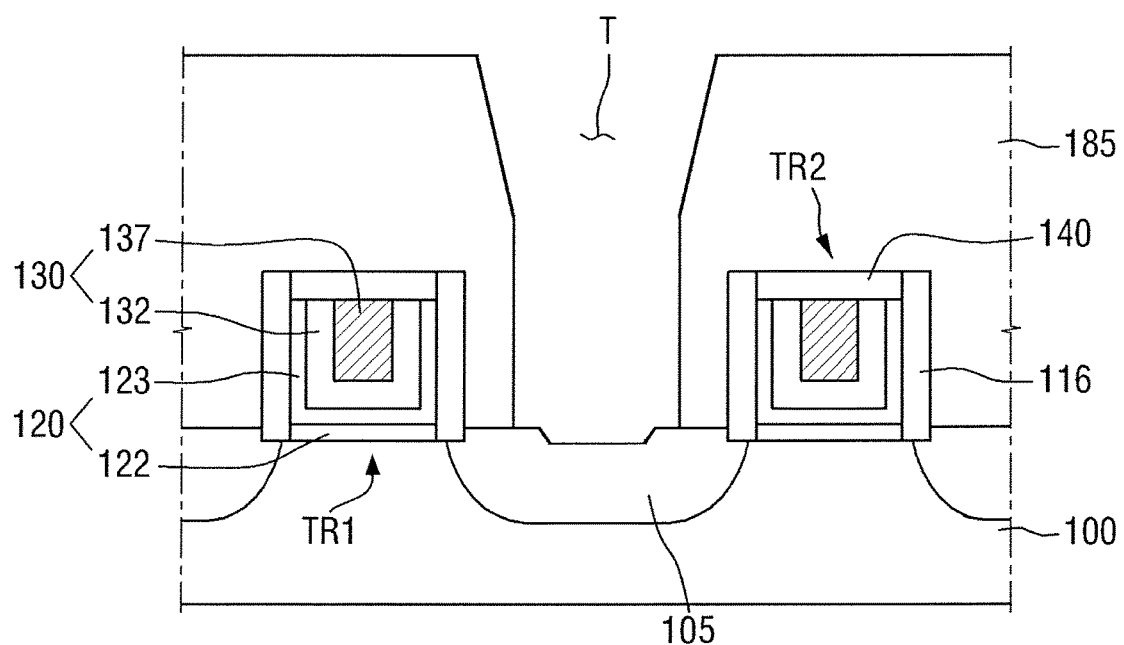

Referring to FIG. 4, the contact hole T may be additionally enlarged. In detail, directional etching using a dry etching process may be performed on a bottom region of the contact hole T. As the result, the contact hole T may have a region having a constant width.

In addition, as shown, a concave portion may be formed on the source/drain 105 through the additional enlargement process. Therefore, the source/drain 105 may have a multi-step structure, but aspects of the present inventive concept are not limited thereto. Therefore, the contact hole T may have a planar bottom surface.

Figure 5:
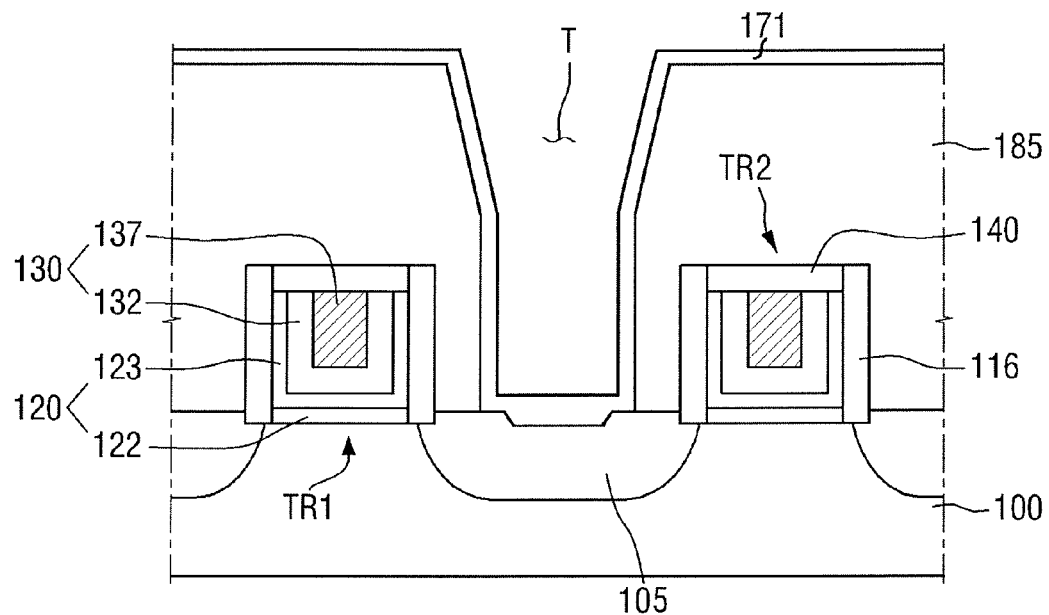

Referring to FIG. 5, a metal layer 171 may be conformally formed in the contact hole T. The forming of the metal layer 171 in the contact hole T may be formed by, for example, chemical vapor deposition (CVD), but aspects of the present inventive concept are not limited thereto. The metal layer 171 may include, for example, at least one of Ni, Co, Pt, Ti, W, Hf, Yb, Tb, Dy, Er, Pd and alloys thereof.

Figure 6:
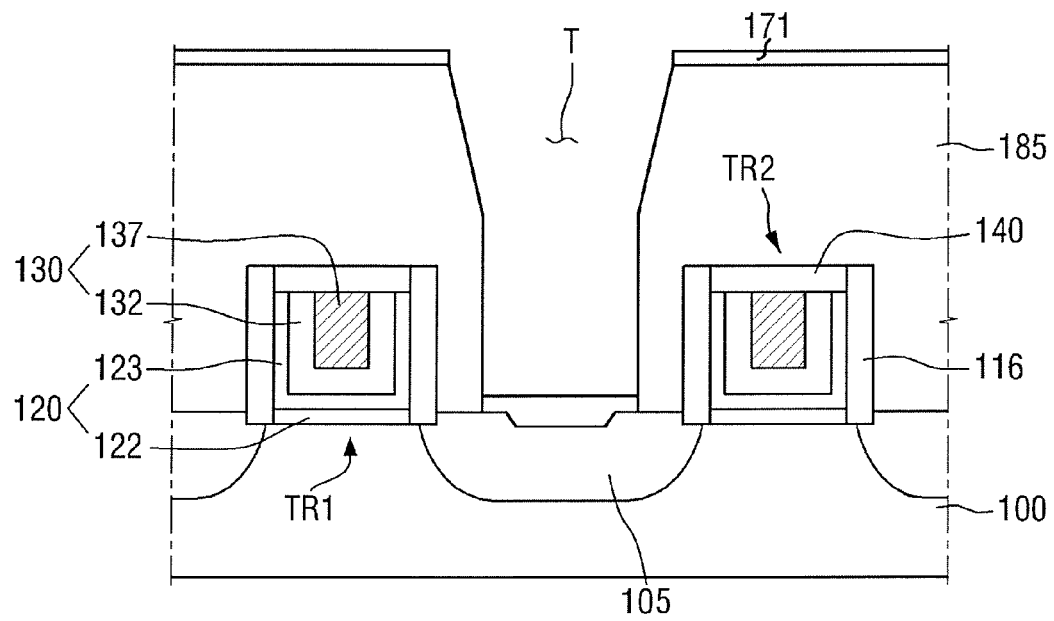

Referring to FIG. 6, the metal layer 171 formed on sidewalls of the contact hole T is removed. The metal layer 171 formed on sidewalls of the contact hole T may be removed by a wet cleaning process using an SC1 cleaning solution, but aspects of the present inventive concept are not limited thereto. When a portion of the metal layer 171 is removed by the wet cleaning process, the metal layer 171 formed on a bottom surface of the contact hole T and an upper surface of the interlayer insulating layer 185 may be thicker than the metal layer 171 formed on the sidewalls of the contact hole T. Accordingly, a portion of the metal layer 171 remains on the bottom surface of the contact hole T over the source/drain 105.

Figure 7:
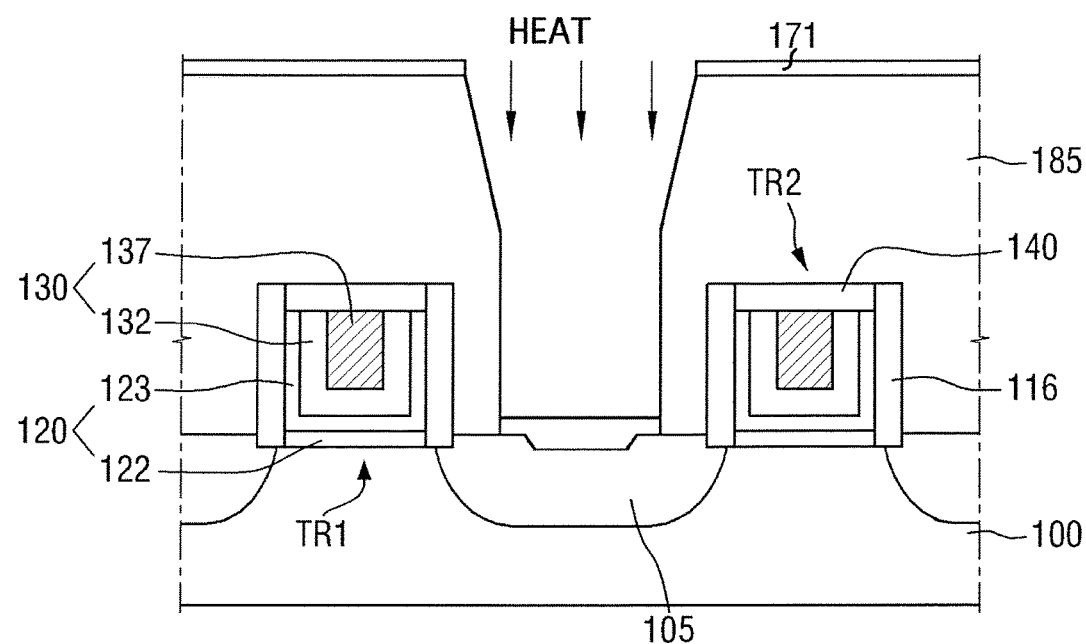
Figure 8:
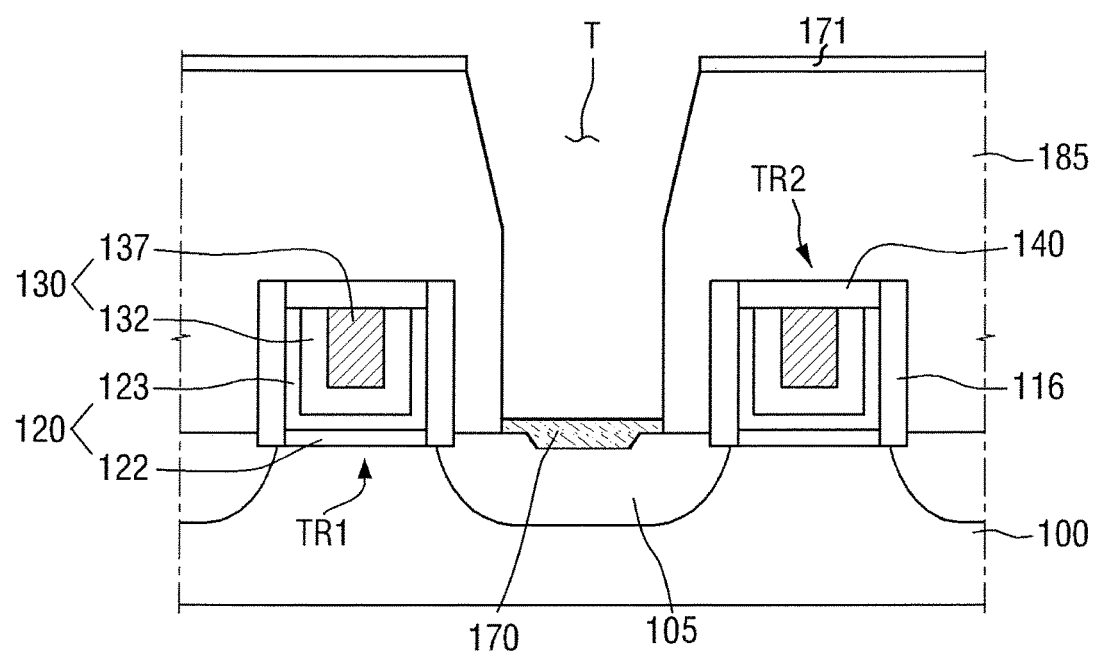

Referring to FIGS. 7 and 8, the metal layer 171 disposed on the source/drain 105 is annealed to form a silicide layer 170. The silicide layer 170 may be formed through a reaction between the upper surface of the source/drain 105 and the metal layer 171. Therefore, the metal layer 171 disposed on the source/drain 105 shown in FIG. 7 and the silicide layer 170 disposed on the source/drain 105 shown in FIG. 8 may have different volumes.

The annealing may be dynamic surface annealing, but aspects of the present inventive concept are not limited thereto.

Figure 9:
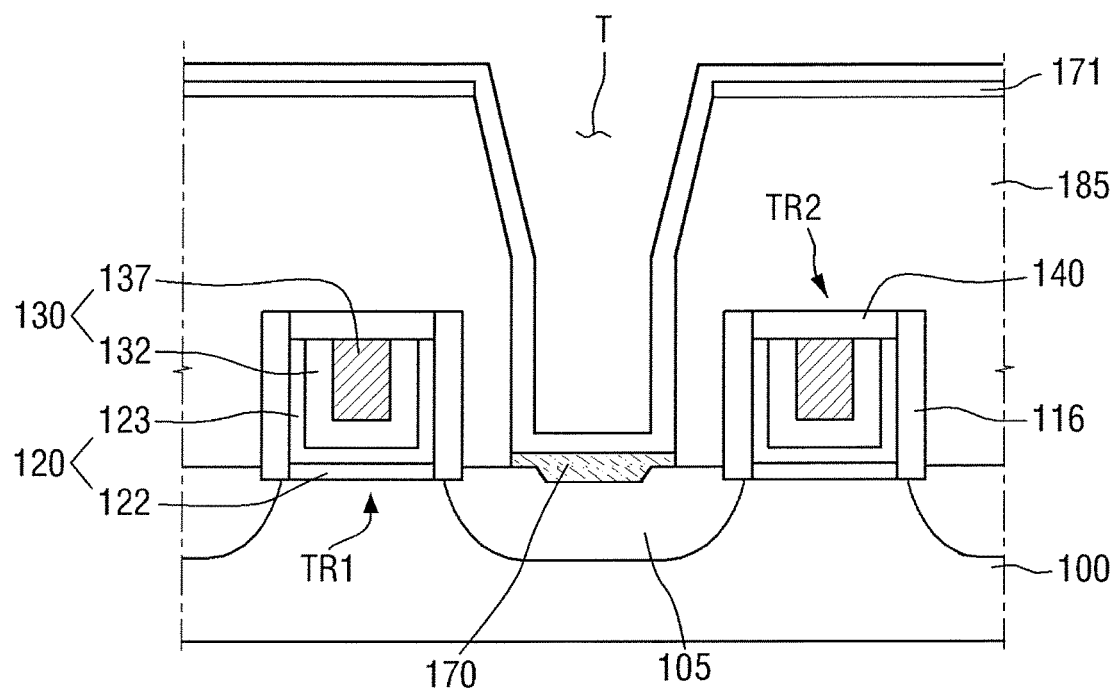

Referring to FIG. 9, a spacer insulating layer 161 may be conformally formed in the contact hole T to cover the silicide layer 170. The forming of the spacer insulating layer 161 on the sidewalls of the contact hole T and the silicide layer 170 may be performed by, for example, chemical vapor deposition (CVD), but aspects of the present inventive concept are not limited thereto.

Figure 10:
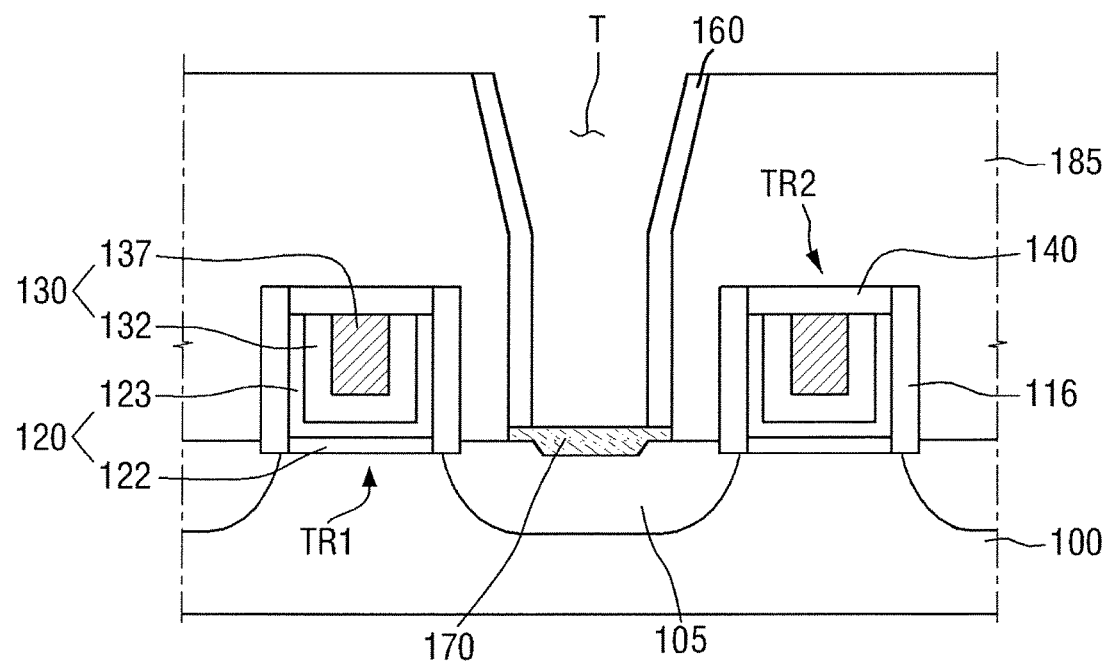

Referring to FIG. 10, the spacer 160 is formed by removing the spacer insulating layer 161 and the silicide layer 170 disposed on an upper surface of the interlayer insulating layer 185. As the result, the spacer 160 may be formed on only the sidewalls of the contact hole T, but aspects of the present inventive concept are not limited thereto.

In the present inventive concept, the spacer 160 is formed after the silicide layer 170 is formed. Therefore, the silicide layer 170 of the present inventive concept may be formed on the source/drain 105 with a larger area than the silicide layer 170 formed after the spacer 160 is first formed.

In addition, an upper surface of the silicide layer 170 and a bottom surface of the spacer 160 may come in contact with each other. The spacer 160 may upwardly extend from the upper surface of the silicide layer 170 to an upper surface of the interlayer insulating layer 185 along the sidewalls of the contact hole T. In addition, as shown, a width of the spacer 160 may be smaller than a width of the upper surface of the silicide layer 170. Therefore, the bottom end of the spacer 160 may entirely overlap the silicide layer 170.

Figure 11:
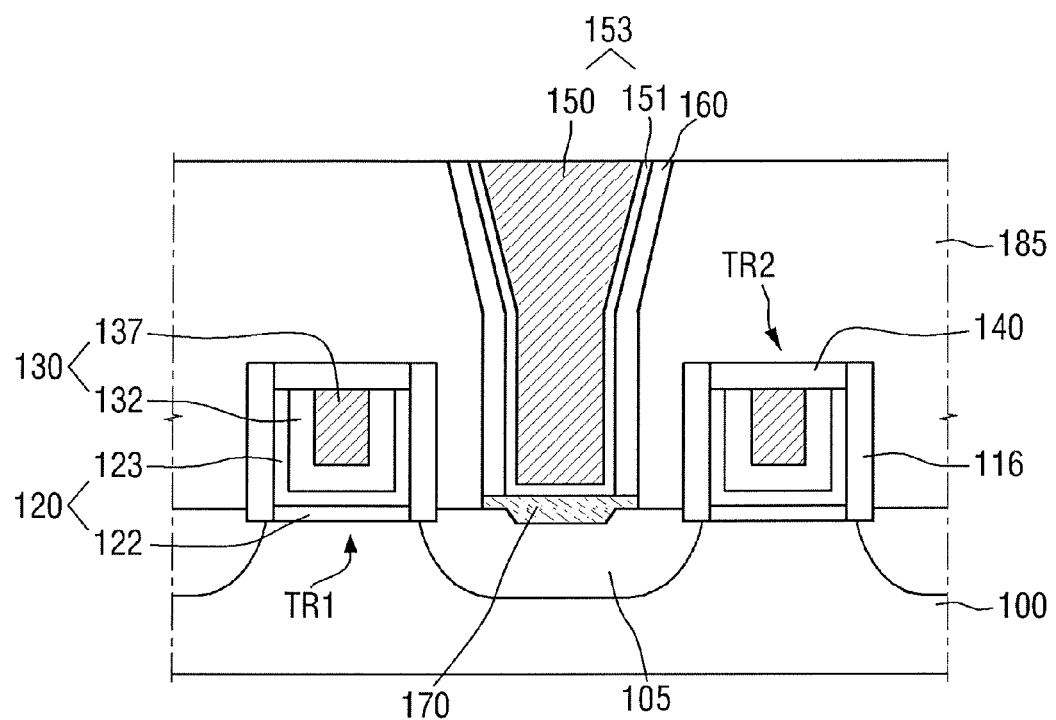

Referring to FIG. 11, a contact barrier layer 151 and a contact metal pattern 150 are formed in the contact hole T, thereby completing a contact 153.

In the above-described description, a contact 153 electrically connected to the source/drain 105 is provided, but aspects of the present inventive concept are not limited thereto. The contact 153 may also be formed on the first and/or second gate electrodes TR1 and TR2 in the same shape and manner. As the result, the contact 153 including the contact barrier layer 151 may be electrically connected to the first and/or second gate electrodes TR1 and TR2, but aspects of the present inventive concept are not limited thereto.

In addition, in the semiconductor device according to an embodiment of the present inventive concept only top ends of the contact 153 may be enlarged. Therefore, as widths of the top ends of the contact 153 is increased, contact areas between the contact 153 and a via connected thereto may be increased, thereby reducing interfacial resistance between each of the contact 153 and the via.

Figure 12:
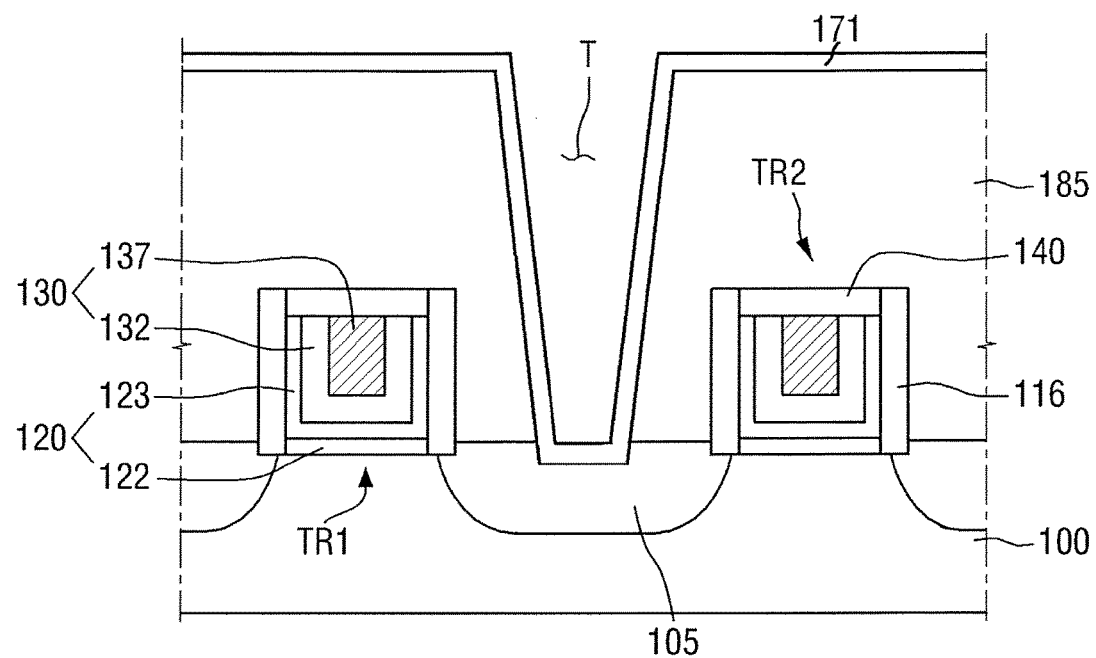
FIG. 12 is a cross-sectional view illustrating a method for fabricating a semiconductor device according to an embodiment of the present inventive concept.

FIG. 12 is a cross-sectional view illustrating a method for fabricating a semiconductor device according to an embodiment of the present inventive concept.

Specifically, FIG. 12 illustrates an intermediate process step of the method for fabricating a semiconductor device according to an embodiment of the present inventive concept, corresponding to the intermediate process step illustrated in FIG. 5. Accordingly the method for fabricating a semiconductor device according to an embodiment of the present inventive concept is substantially the same with the method for fabricating a semiconductor device described above, except for the intermediate process step illustrated in FIG. 5. Therefore, the following description will focus on differences between the methods for fabricating a semiconductor device according to the present and previous embodiments of the present inventive concept.

Referring to FIG. 12, a contact hole T is not subjected to an additional enlargement process and has sidewalls having a continuous slope. Therefore, a width of the contact hole T ranging from its bottom end to its top end may be continuously increased.

Figure 13:
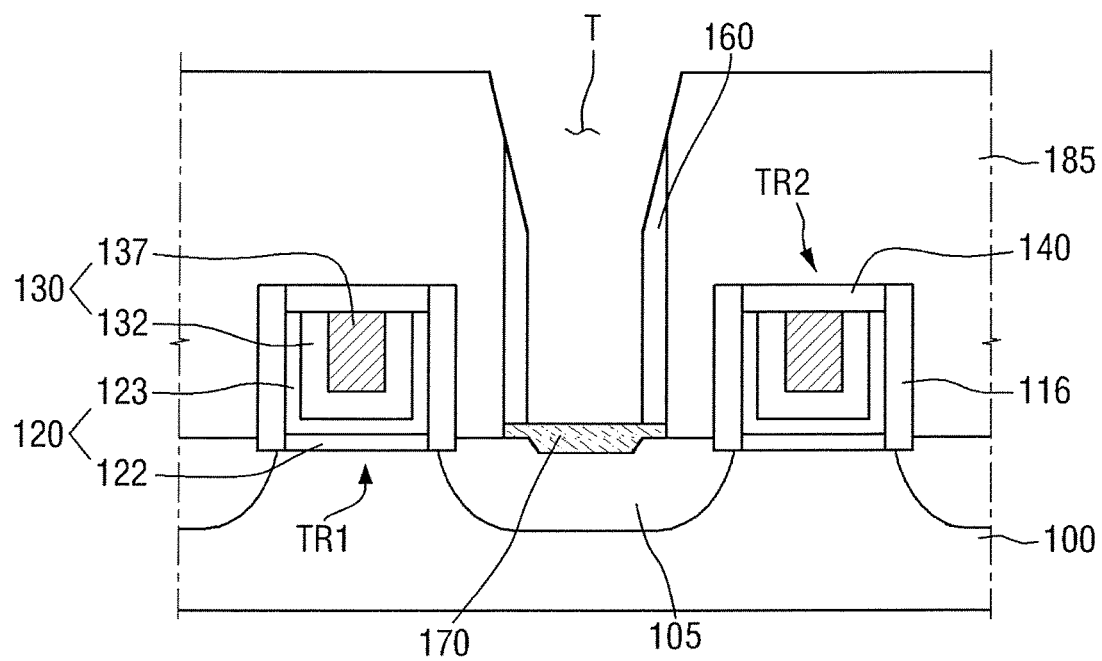
FIGS. 13 and 14 are cross-sectional views illustrating a method for fabricating a semiconductor device according to an embodiment of the present inventive concept.
Figure 14:
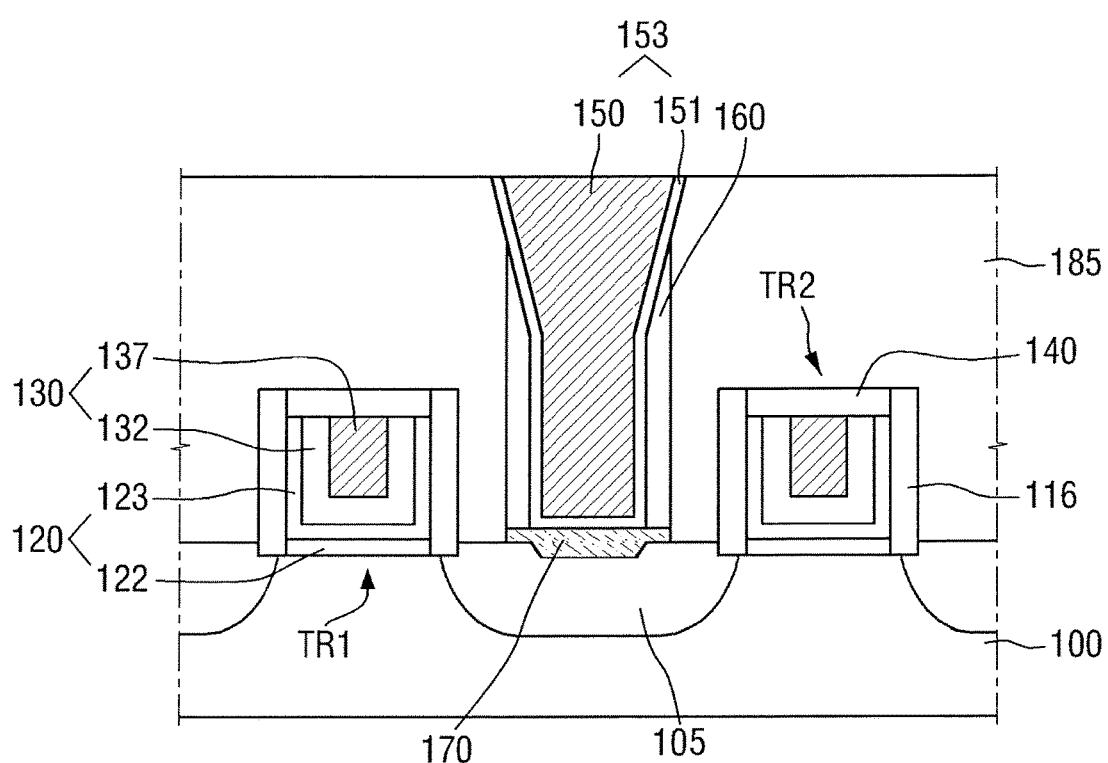

FIGS. 13 and 14 are cross-sectional views illustrating a method for fabricating a semiconductor device according to an embodiment of the present inventive concept.

Specifically, FIGS. 13 and 14 illustrate intermediate process steps of the method for fabricating a semiconductor device according to an embodiment of the present inventive concept, corresponding to the intermediate process steps illustrated in FIGS. 10 and 11. Accordingly the method for fabricating a semiconductor device according to an embodiment of the present inventive concept is substantially the same with the method for fabricating a semiconductor device according to the above-described embodiment of the present inventive concept, except for the intermediate process steps illustrated in FIGS. 10 and 11. Therefore, the following description will focus on differences between the methods for fabricating a semiconductor device according to the present and previous embodiments of the present inventive concept.

Referring to FIGS. 13 and 14, a spacer 160 may be formed on only some portions of sidewalls of a contact hole T. Therefore, the spacer 160 may not be exposed on an upper surface of an interlayer insulating layer 185.

Figure 15:
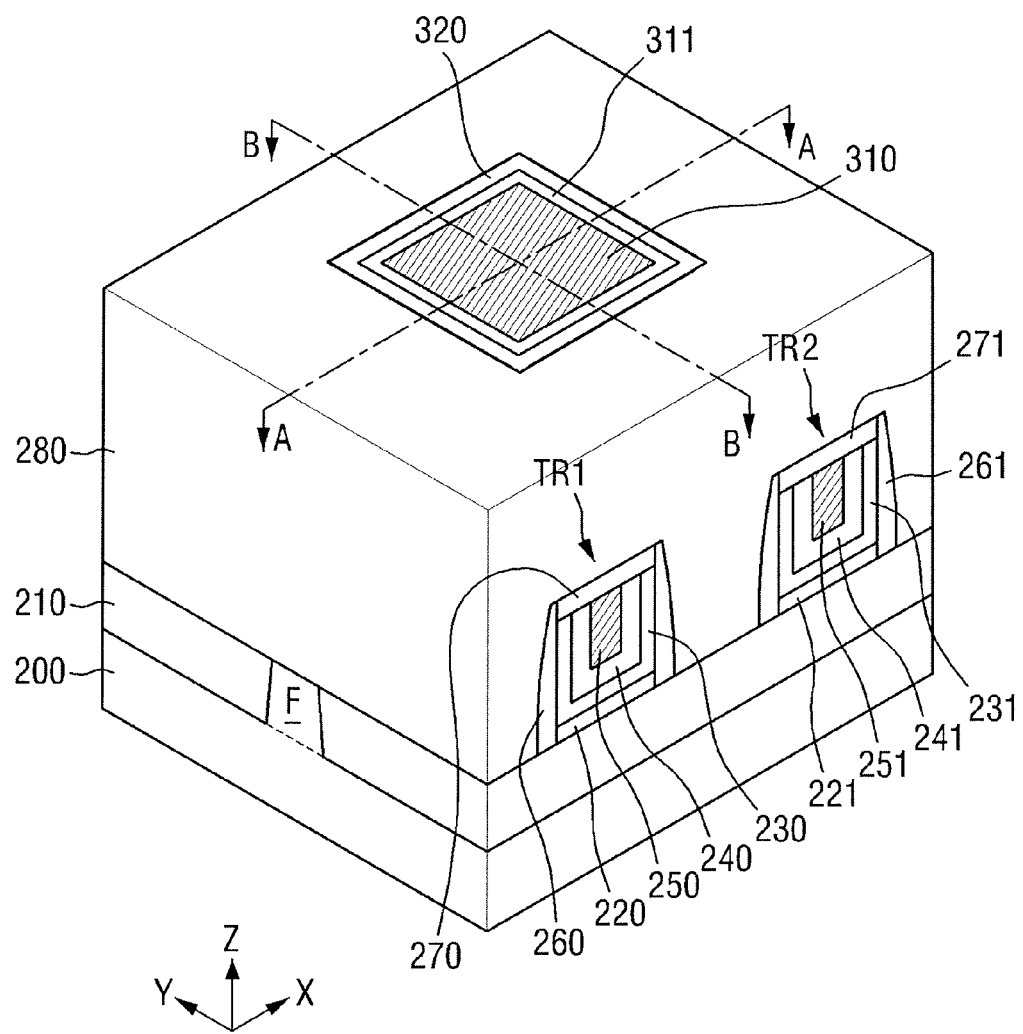
FIG. 15 is a perspective view of a semiconductor device according to an embodiment of the present inventive concept.
Figure 16:
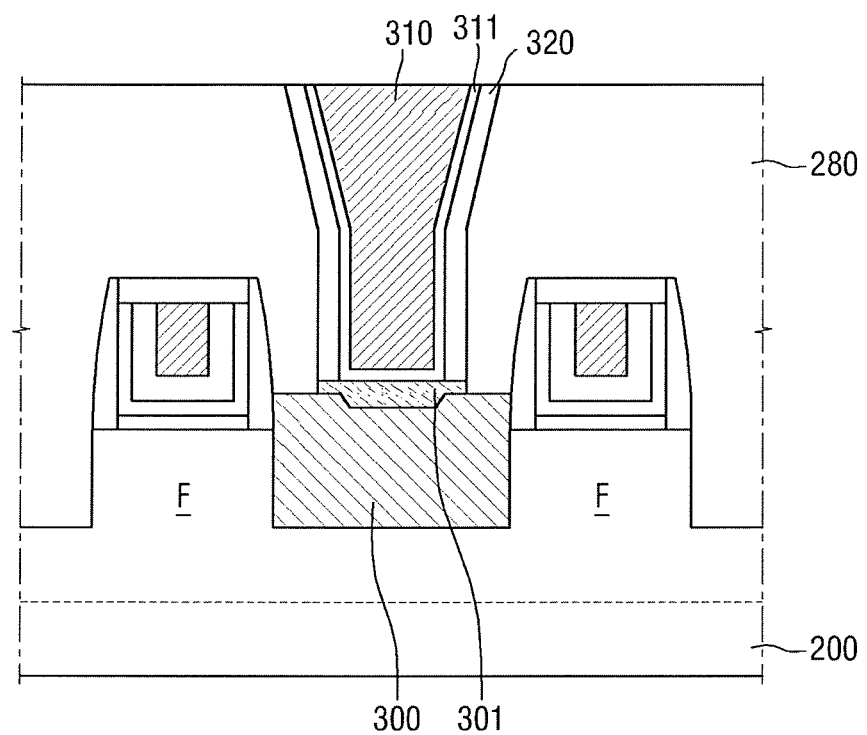
FIG. 16 is a cross-sectional view taken along the line A-A of FIG. 15.
Figure 17:
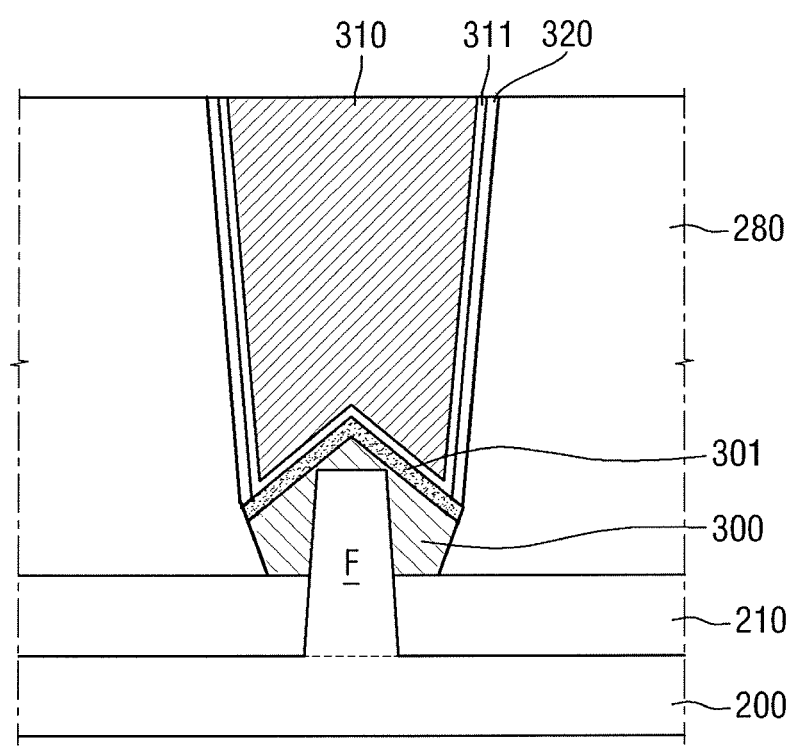
FIG. 17 is a cross-sectional view taken along the line B-B of FIG. 15.

FIG. 15 is a perspective view of a semiconductor device according to an embodiment of the present inventive concept, FIG. 16 is a cross-sectional view taken along the line A-A of FIG. 15, and FIG. 17 is a cross-sectional view taken along the line B-B of FIG. 15. For the sake of convenient explanation, the same part as that of the semiconductor device according to the previous embodiment of the present inventive concept will not be repeated.

Referring to FIGS. 15 to 17, the semiconductor device according to an embodiment of the present inventive concept will be described with regard to a fin type semiconductor by way of example.

That is to say, in the semiconductor device according to an embodiment of the present inventive concept, a substrate 200 may include a fin type active pattern. When the substrate 200 includes a fin type active pattern, the fin type active pattern may include, for example, an element semiconductor material, such as silicon or germanium. In addition, the fin type active pattern may include a compound semiconductor, such as a group IV-IV compound semiconductor, or a group III-V compound semiconductor.

In detail, the fin type active pattern may include the group IV-IV compound semiconductor, including, for example, a binary compound or a ternary compound, including two or more group IV elements, such as carbon (C), silicon (Si), germanium (Ge), or tin (Sn), or a compound prepared by doping a group IV element into the binary or ternary compound.

In addition, the fin type active pattern may include the group III-V compound semiconductor, including, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In detail, the semiconductor device according to the present embodiment includes a substrate 200, a field insulation layer 210, a fin F, a first gate electrode TR1, a second gate electrode TR2, an interlayer insulating layer 280, a source/drain 300, a silicide layer 301, a contact metal pattern 310, a contact barrier layer 311, and a spacer 320.

The substrate 200 may be a rigid substrate, such as a silicon substrate, a silicon on insulator (SOI) substrate, a gallium arsenide substrate, a silicon germanium, a ceramic substrate, a quartz substrate or a glass substrate for display, or a flexible plastic substrate, such as a substrate made of polyimide, polyester, polycarbonate, polyethersulfone, polymethylmethacrylate, polyethylene naphthalate or polyethyleneterephthalate.

The field insulation layer 210 is formed on the substrate 200 to be used for device isolation. The field insulation layer 210 may include an insulation layer, such as a HDP oxide layer, a SOG oxide layer, or a CVD oxide layer, but aspects of the present inventive concept are not limited thereto.

The fin F is formed on the substrate 200. In particular, the fin F may protrude from the substrate 200. Specifically, the fin F may protrude from the substrate 200 in a third direction Z. The fin F may be a portion of the substrate 200 or may include an epitaxial layer grown from the substrate 200. The fin F may extend lengthwise in a first direction X. The field insulation layer 210 may cover an upper surface of the substrate 100 and some portions of lateral surfaces of the fin F.

The first gate electrode TR1 may be formed on the fin F so as to intersect the fin F. That is to say, the first gate electrode TR1 may extend lengthwise in a second direction Y.

The first gate electrode TR1 may include a second interface layer 220, a second gate insulation layer 230, a second work function control layer 240, a second gate metal 250, a second gate spacer 260, and a second capping pattern 270, which are sequentially formed on the fin F. With this configuration, a channel may be formed on the opposite lateral surfaces and an upper surface of the fin F.

The second interface layer 220 may be formed on the field insulation layer 210 and the fin F. The second interface layer 220 may prevent an interfacial failure from occurring between the field insulation layer 210 and the second gate insulation layer 230.

The second interface layer 220 may include a low-k dielectric material having a dielectric constant (k) of 9 or less, for example, a silicon oxide layer (k≈4) or a silicon oxynitride layer k≈4~8 according to the concentration of oxygen and nitrogen atoms). Alternatively, the second interface layer 220 may include silicate or a combination of layers listed above.

The second gate insulation layer 230 may be formed on the second interface layer 220. However, when the second interface layer 220 is not provided, the second gate insulation layer 230 may be formed on the field insulation layer 210 and the fin F.

The second gate insulation layer 230 may include a high-k material. In detail, the second gate insulation layer 230 may include, for example, one or more selected from the group consisting of HfSiON, $HfO_2$, $ZrO_2$, $Ta_2O_5$, $TiO_2$, $SrTiO_3$, $BaTiO_3$, and $SrTiO_3$.

Meanwhile, the second gate insulation layer 230 may be formed to have an appropriate thickness according to the kind of a device to be formed. For example, when the second gate insulation layer 230 includes $HfO_2$, it may be formed to have a thickness of about 50 Å or less (in a range of about 5 Å to about 50 Å), but aspects of the present inventive concept are not limited thereto. The second gate insulation layer 230 may upwardly extend along sidewalls of the second gate spacer 260 to be described later.

The second work function control layer 240 may be formed on the second gate insulation layer 230. The second work function control layer 240 may be formed to be in contact with the second gate insulation layer 230. The second work function control layer 240 may be used to control a work function.

The second work function control layer 240 may include, for example, metal nitride. In detail, the second work function control layer 240 may include, for example, at least one of Mo, Pd, Ru, Pt, TiN, WN, TaN, Ir, TaC, RuN, TiAl, TaAlC, TiAlN, and MoN. In more detail, the second work function control layer 240 may include a single layer made of TiN or dual layers of a TiN lower layer and a TaN upper layer, but aspects of the present inventive concept are not limited thereto.

The second work function control layer 240 may also upwardly extend along sidewalls of the second gate spacer 260 to be described later.

The second gate metal 250 may be formed on the second work function control layer 240. As shown, the second gate metal 250 may be formed to be in contact with the second work function control layer 240. That is to say, the second gate metal 250 may be formed to fill a space created by the second work function control layer 240. The second gate metal 250 may include a conductive material, for example, W or Al, but aspects of the present inventive concept are not limited thereto.

The second gate spacer 260 may be formed on at least one side of lateral surfaces of the first gate electrode TR1. The second gate spacer 260 may include, for example, at least one of a nitride layer, and an oxynitride layer.

In addition, the second gate spacer 260 having an I-letter shaped lateral surface is illustrated, but aspects of the present inventive concept are not limited thereto. The shape of the second gate spacer 260 may be varied. Unlike in the illustrated embodiment, the second gate spacer 260 may have a curved or L-letter shaped lateral surface.

In addition, the second gate spacer 260 may include a single layer, but aspects of the present inventive concept are not limited thereto. Rather, the second gate spacer 260 may include multiple layers.

The second capping pattern 270 may be formed on the second gate metal 250. As shown, the second capping pattern 270 may be formed to be in contact with the second gate metal 250. That is to say, the second capping pattern 270 may be formed in the first gate electrode TR1 to fill a space created on the second gate metal 250. The second capping pattern 270 may include, for example, silicon nitride (SiN), but aspects of the present inventive concept are not limited thereto.

The second gate electrode TR2 may be formed on the fin F so as to intersect the fin F. The second gate electrode TR2 may extend lengthwise in the second direction Y.

The second gate electrode TR2 may have substantially the same configuration with the above-described first gate electrode TR1. That is to say, the second gate electrode TR2 may include a third interface layer 221, a third gate insulation layer 231, a third work function control layer 241, a third gate metal 251, a third gate spacer 261, and a third capping pattern 271.

The third interface layer 221, the third gate insulation layer 231, the third work function control layer 241, the third gate metal 251, the third gate spacer 261, and the third capping pattern 271 are substantially the same with the second interface layer 220, the second gate insulation layer 230, the second work function control layer 240, the second gate metal 250, the second gate spacer 260, and the second capping pattern 270, respectively.

The interlayer insulating layer 280 may be formed on the substrate 200 and may be formed to surround the first gate electrode TR1 and the second gate electrode TR2. The interlayer insulating layer 280 may include, for example, at least one of a low-k material, an oxide layer, a nitride layer and an oxynitride layer. The low-k material may include, for example, at least one of silicon oxide, silicon nitride, silicon oxynitride, and a low-k material. The low-k material may include flowable oxide (FOX), Tonen silazene (TOSZ), undoped silicate glass (USG), borosilica glass (BSG), phosphosilaca glass (PSG), borophosphor silica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and combinations thereof, but aspects of the present inventive concept are not limited thereto.

Meanwhile, the source/drain 300 may be formed between the first gate electrode TR1 and the second gate electrode TR2 may be formed within the fin F. The source/drain 300 may be insulated from the first and second gate patterns TR1 and TR2 by the second gate spacer 260 and the third gate spacer 261, respectively.

When the semiconductor device according to the present embodiment is an NMOS transistor, the source or drain 300 may include the same material as the substrate 200 or a tensile stress material. For example, when the substrate 200 includes Si, the source/drain 300 includes a material having a smaller lattice constant than Si (e.g., SiC or SiP). The tensile stress material may improve the mobility of carriers of a channel region by applying tensile stress to the channel region.

Meanwhile, when the semiconductor device according to the present embodiment is a PMOS transistor, the source or drain 300 may include a compressive stress material. For example, the compressive stress material may include a material having a larger lattice constant than Si, e.g., SiGe. The compressive stress material may improve the mobility of carriers of a channel region by applying compressive stress to the channel region.

In some embodiments of the present inventive concept, the source/drain 300 may be formed by epitaxial growth, but aspects of the present inventive concept are not limited thereto.

The silicide layer 301 may be formed on the source/drain 300. The silicide layer 301 may include at least one of NiPtSi, NiSi, CoSi, and TiSi, but aspects of the present inventive concept are not limited thereto. The silicide layer 301 may be insulated from the first and second gate patterns TR1 and TR2 by the second gate spacer 260, the third gate spacer 261 and the interlayer insulating layer 280.

The silicide layer 301 may be formed on the source/drain 300 exposed to the outside using a silicide process before a contact metal pattern 310 and a contact barrier layer 311 to be described later are formed. That is to say, the silicide layer 301 may be formed by substantially the same method as described above in the method for fabricating the semiconductor device according to an embodiment of the present inventive concept.

The contact barrier layer 311 may be formed on an active region of the substrate 200 to cover sidewalls and a bottom surface of a contact hole formed on the source/drain 300. The contact barrier layer 311 may include, for example, Ti or TiN, and may include a stack of Ti and TiN layers.

The contact barrier layer 311 may be formed by atomic layer deposition (ALD) or chemical vapor deposition (CVD).

The contact metal pattern 310 may be formed on the contact barrier layer 311. The contact metal pattern 310 may include a metallic material. For example, the contact metal pattern 150 may include tungsten (W), aluminum (Al), cobalt (Co), and the like, but aspects of the present inventive concept are not limited thereto. The contact metal pattern 310 may be a conductive pattern electrically connecting an upper semiconductor pattern and a lower semiconductor pattern.

The spacer 320 may be formed to be in contact with some portions of sidewalls of the contact hole T formed by etching a portion of the interlayer insulating layer 280. The contact hole T may be formed in the interlayer insulating layer 280 to expose the silicide layer 301 between the first gate electrode TR1 and the second gate electrode TR2. The spacer 320 may be formed to be spaced apart from the first gate electrode TR1 and the second gate electrode TR2.

Figure 18:
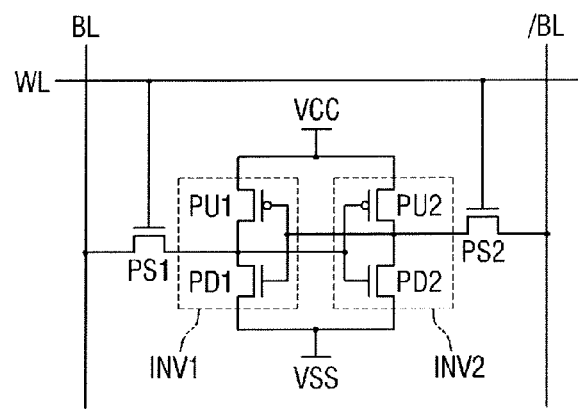
FIGS. 18 to 20 are a circuit view and layout views of a semiconductor device according to an embodiment of the present inventive concept.
Figure 19:
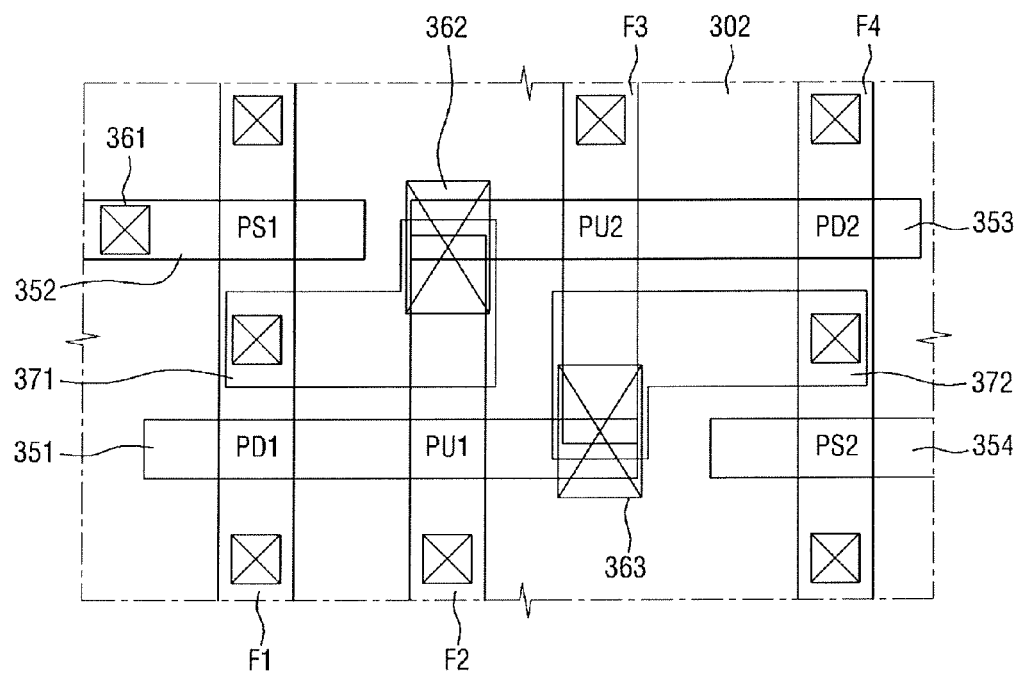
Figure 20:
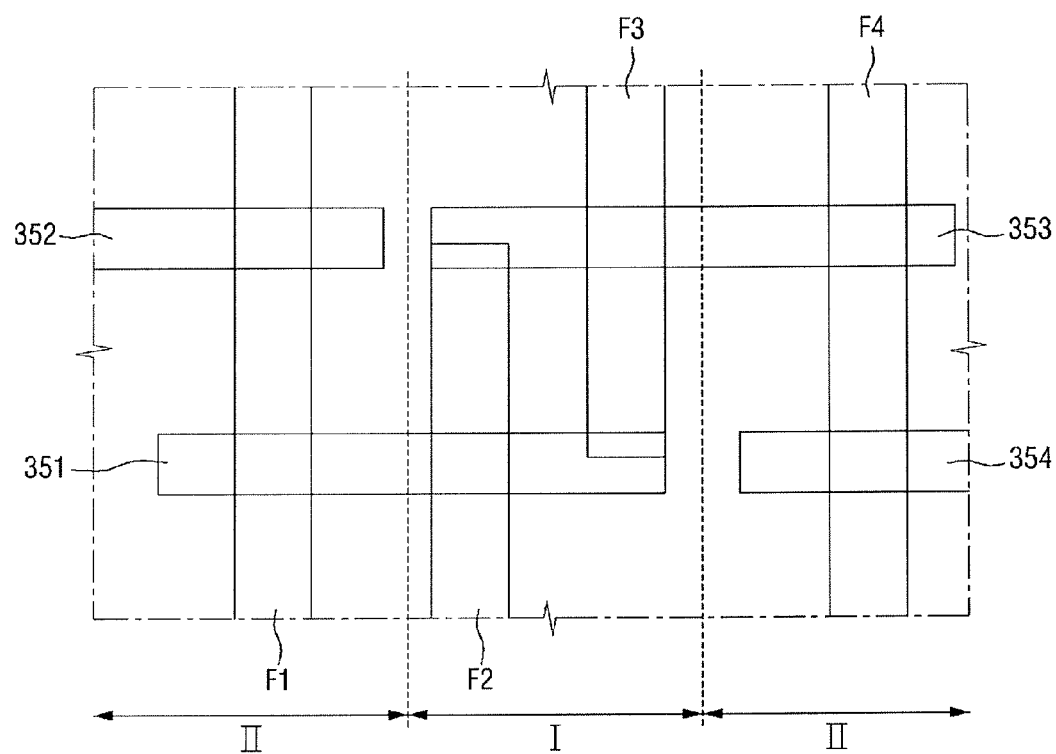

FIGS. 18 to 20 are a circuit view and layout views of a semiconductor device according to an embodiment of the present inventive concept. Specifically, FIGS. 18 and 19 are a circuit view and a layout view of a semiconductor device according to an embodiment of the present inventive concept and FIG. 20 is a layout view illustrating a plurality of fins and a plurality of gate structures. The semiconductor devices according to some embodiments of the present inventive concept can be applied to all devices including general logic devices using fin type transistors, but FIGS. 18 to 20 illustrate the semiconductor device according to an embodiment of the present inventive concept with regard to a static random access memory (SRAM) by way of example.

First, referring to FIG. 18, the semiconductor device according to an embodiment of the present inventive concept may include a pair of inverters INV1 and INV2 connected in parallel between a power supply node Vcc and a ground node Vss, and a first pass transistor PS1 and a second pass transistor PS2 connected to output nodes of the inverters INV1 and INV2.

The first pass transistor PS1 and the second pass transistor PS2 may be connected to a bit line BL and a complementary bit line /BL. Gates of the first pass transistor PS1 and the second pass transistor PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other.

The first pull-up transistor PU1 and the second pull-up transistor PU2 may be PMOS transistors, and the first pull-down transistor PD1 and the second pull-down transistor PD2 may be NMOS transistors.

In addition, in order to constitute a latch circuit, an input node of the first inverter INV1 may be connected to an output node of the second inverter INV2 and an input node of the second inverter INV2 may be connected to an output node of the first inverter INV1.

Referring to FIGS. 18 to 20, a first fin F1, a second fin F2, a third fin F3, and a fourth fin F4, which are spaced apart from one another, may extend lengthwise in one direction (e.g., in an up-and-down direction of FIG. 16). The second fin F2 and the third fin F3 may extend in shorter lengths than the first fin F1 and the fourth fin F4.

In addition, a first gate structure 351, a second gate structure 352, a third gate structure 353, and a fourth gate structure 354 may extend lengthwise in the other direction (e.g., in a left-and-right direction of FIG. 19) so as to intersect the first to fourth fins F1 to F4.

In detail, the first gate structure 351 completely intersects the first fin F1 and the second fin F2 while partially overlapping with a termination of the third fin F3. The third gate structure 353 completely intersects the fourth fin F4 and the third fin F3 while partially overlapping with a termination of the second fin F2. The second gate structure 352 and the fourth gate structure 354 are formed to intersect the first fin F1 and the fourth fin F4, respectively.

As shown in FIG. 19, the first pull-up transistor PU1 is defined in vicinity of an intersection of the first gate structure 351 and the second fin F2, the first pull-down transistor PD1 is defined in vicinity of an intersection of the first gate structure 351 and the first fin F1, and the first pass transistor PS1 is defined in vicinity of an intersection of the second gate structure 352 and the first fin F1.

The second pull-up transistor PU2 is defined in vicinity of an intersection of the third gate structure 353 and the third fin F3, the second pull-down transistor PD2 is defined in vicinity of an intersection of the third gate structure 353 and the fourth fin F4, and the second pass transistor PS2 is defined in vicinity of an intersection of the fourth gate structure 354 and the fourth fin F4.

Although not specifically shown, recesses are formed at opposite sides of intersections of the first to fourth gate structures 351-354 and the first to fourth fins F1 to F4, source or drain regions may be formed in the recesses, and a plurality of contacts 361 may be formed.

Further, a shared contact 362 concurrently connects the second fin F2, the third gate structure 353 and a wire 371. A shared contact 363 may also concurrently connect the third fin F3, the first gate structure 351 and a wire 372.

For example, the semiconductor devices according to some embodiments of the present inventive concept may be employed to the first pull-up transistor PU1, the first pull-down transistor PD1, the first pass transistor PS1, the second pull-up transistor PU2, the second pull-down transistor PD2, and the second pass transistor PS2.

Figure 21:
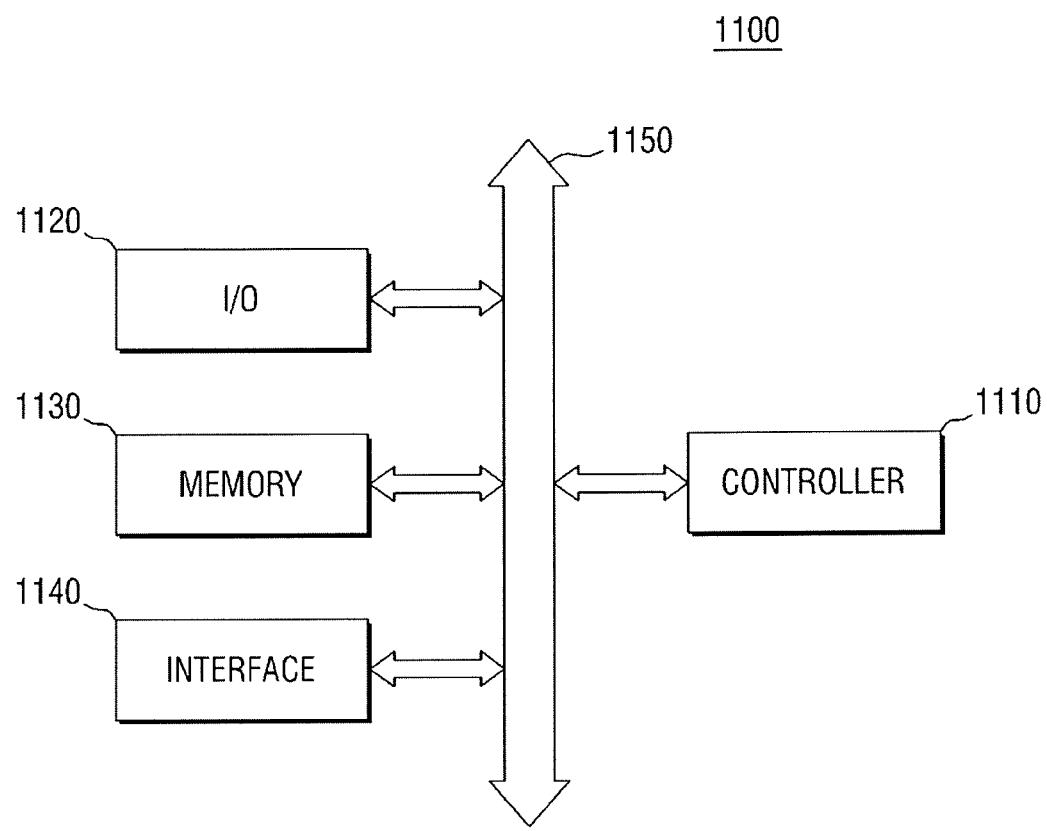
FIG. 21 is a block diagram of an electronic system including semiconductor devices according to embodiments of the present inventive concept.

FIG. 21 is a block diagram of an electronic system including semiconductor devices according to embodiments of the present inventive concept.

Referring to FIG. 21, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include a high-speed DRAM and/or SRAM as a working memory for improving the operation of the controller 1110. The aforementioned semiconductor devices according to the embodiments of the present inventive concept may be provided in the memory device 1130 or may be provided as some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 22:
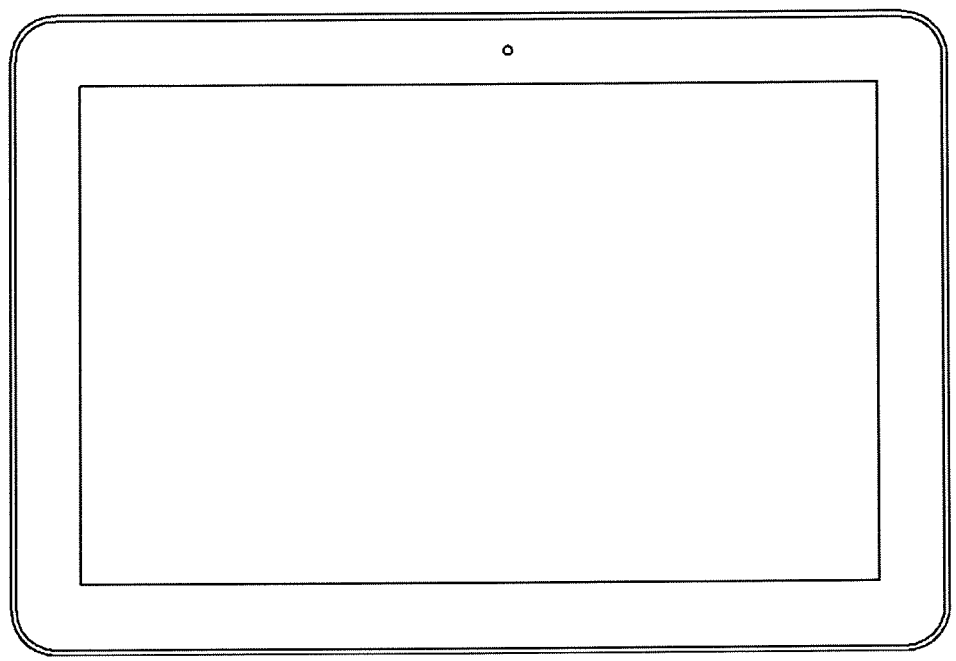
FIG. 22 illustrates a device including a semiconductor device fabricated using a method for fabricating a semiconductor device according to an exemplary embodiment of the present inventive concept.
Figure 23:
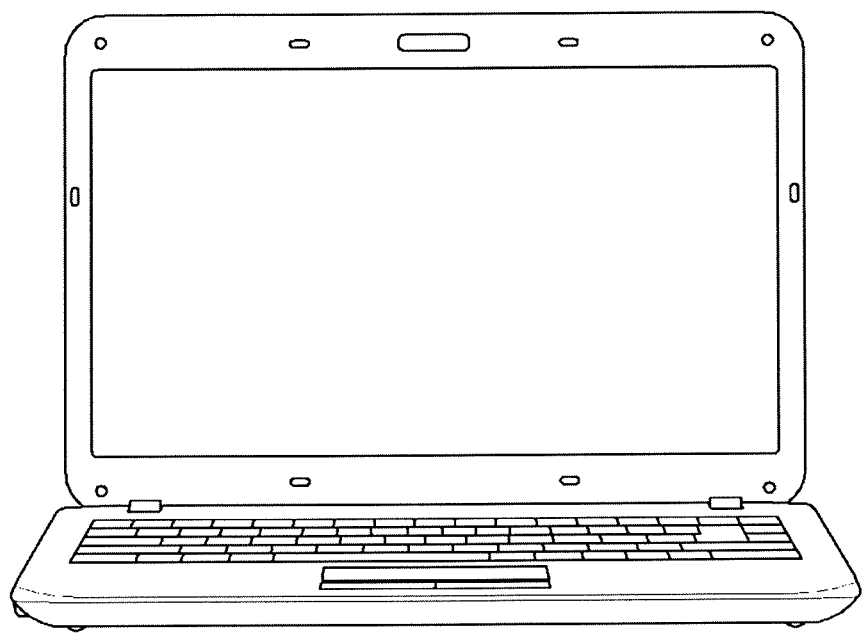
FIG. 23 illustrates a device including a semiconductor device fabricated using a method for fabricating a semiconductor device according to an exemplary embodiment of the present inventive concept.

FIG. 22 illustrates a device including a semiconductor device fabricated using a method for fabricating a semiconductor device according to an exemplary embodiment of the present inventive concept. FIG. 23 illustrates a device including a semiconductor device fabricated using a method for fabricating a semiconductor device according to an exemplary embodiment of the present inventive concept. Specifically, FIG. 22 illustrates an example in which a semiconductor device according to an embodiment of the present inventive concept is applied to a tablet PC and FIG. 23 illustrates an example in which a semiconductor device according to an embodiment of the present inventive concept is applied to a notebook computer. It is obvious to one skilled in the art that the semiconductor devices according to some embodiments of the present inventive concept may also be applied to other IC devices not illustrated herein.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method for fabricating a semiconductor device, the method comprising:
  forming a gate electrode and a source or drain disposed at a side of the gate electrode;
  forming an interlayer insulating layer covering the gate electrode and the source or drain;
  forming a contact hole exposing the source or drain in the interlayer insulating layer;
  forming a silicide layer on a bottom surface of the contact hole; and
  forming a spacer on sidewalls of the contact hole and an upper surface of the silicide layer,
  wherein the forming of the silicide layer comprises:
  forming a metal layer conformally covering the bottom surface of the contact hole and the sidewalls of the contact hole;
  annealing the metal layer; and
  removing the metal layer covering the sidewalls of the contact hole.

2. The method of claim 1, wherein a bottom end of the spacer is in contact with an edge of the upper surface of the silicide layer.

3. The method of claim 2, wherein at least a center portion of the silicide layer is exposed by the spacer.

4. The method of claim 2, wherein the spacer extends from the upper surface of the silicide layer to an upper region of the contact hole along the sidewalls of the contact hole.

5. The method of claim 1, wherein a width of the spacer is smaller than a width of the upper surface of the silicide layer.

6. The method of claim 5, wherein a bottom end of the spacer entirely overlaps the silicide layer.

7. The method of claim 1, wherein the forming of the spacer comprises forming a spacer insulating layer conformally covering the upper surface of the silicide layer and the sidewalls of the contact hole and removing a portion of the spacer insulating layer formed on the upper surface of the silicide layer.

8. The method of claim 1, wherein at least a portion of a lateral surface of the silicide layer is in contact with a sidewall of the interlayer insulating layer.

9. The method of claim 1, further comprising forming a contact filling the contact hole on the spacer.

10. A method for fabricating a semiconductor device, the method comprising:
forming a gate electrode on a substrate;
forming a source or drain on at least one side of the gate electrode;
forming an interlayer insulating layer covering the gate electrode and the source or drain;
forming a contact hole in the interlayer insulating layer, the contact hole exposing the source or drain;
forming a metal layer covering a bottom surface of the contact hole;
removing the metal layer from sidewalls of the contact hole;
annealing the metal layer to form a silicide layer;
forming a spacer comprising insulating material on a sidewall of the contact hole, the spacer exposing an upper surface of the silicide layer;
forming a contact barrier layer covering a sidewall of the spacer and the upper surface of the silicide layer; and
forming a contact metal pattern on the contact barrier layer, the contact metal pattern filling the contact hole.

11. The method of claim 10, wherein a bottom end of the spacer is in contact with the upper surface of the silicide layer.

12. The method of claim 10, wherein a width of the spacer is smaller than a width of the upper surface of the silicide layer.

13. The method of claim 12, wherein a bottom end of the spacer entirely overlaps the silicide layer.

14. The method of claim 10, wherein at a portion of a lateral surface of the silicide layer is in contact with a sidewall of the interlayer insulating layer.

15. A method for fabricating a semiconductor device, the method comprising:
forming a gate electrode on a substrate;
forming a source or drain on at least one side of the gate electrode;
forming an interlayer insulating layer covering the gate electrode and the source or drain;
forming a contact hole in the interlayer insulating layer, the contact hole exposing the source or drain;
forming a silicide layer on a bottom surface of the contact hole;
forming a spacer comprising insulating material on a sidewall of the contact hole, the spacer exposing an upper surface of the silicide layer;
forming a contact barrier layer covering a sidewall of the spacer and the upper surface of the silicide layer; and
forming a contact metal pattern on the contact barrier layer, the contact metal pattern filling the contact hole.

16. The method of claim 15, wherein the forming of the silicide layer comprises forming a metal layer covering the bottom surface of the contact hole and the sidewall of the contact hole and removing the metal layer from the sidewall of the contact hole and annealing the metal layer to form the silicide layer.

17. The method of claim 1, wherein the spacer comprises insulating material.

18. The method of claim 1, after forming of the spacer, further comprising forming a contact barrier layer covering a sidewall of the spacer and the upper surface of the silicide layer, the contact barrier layer contacts the sidewall of the spacer and the upper surface of the silicide layer.

19. The method of claim 10, wherein the contact barrier layer contacts the sidewall of the spacer and the upper surface of the silicide layer.

20. The method of claim 15, wherein the contact barrier layer contacts the sidewall of the spacer and the upper surface of the silicide layer.

* * * * *